(12) United States Patent
Momiuchi

(10) Patent No.: US 7,082,150 B2
(45) Date of Patent: Jul. 25, 2006

(54) SEMICONDUCTOR LASER DEVICE

(75) Inventor: Masayuki Momiuchi, Tokyo-to (JP)

(73) Assignee: Kabushiki Kaisha TOPCON, Tokyo-to (JP)

( * ) Notice: Subject to any disclaimer, the term of this patent is extended or adjusted under 35 U.S.C. 154(b) by 161 days.

(21) Appl. No.: 10/661,332

(22) Filed: Sep. 12, 2003

(65) Prior Publication Data

US 2004/0052286 A1   Mar. 18, 2004

(30) Foreign Application Priority Data

Sep. 17, 2002  (JP)  ............................. 2002-270300

(51) Int. Cl.
   *H01S 3/091*  (2006.01)
(52) U.S. Cl. ........................................................ 372/75
(58) Field of Classification Search .................. None
   See application file for complete search history.

(56) References Cited

U.S. PATENT DOCUMENTS 5,351,259 A * 9/1994 Ishimori et al. ............... 372/75
5,369,661 A * 11/1994 Yamaguchi et al. ........... 372/69
5,513,201 A * 4/1996 Yamaguchi et al. ........... 372/75
5,689,522 A * 11/1997 Beach ............................ 372/75
5,761,234 A * 6/1998 Craig et al. .................... 372/75
6,061,378 A * 5/2000 Marshall et al. ............... 372/75
6,111,900 A   8/2000 Suzudo .......................... 372/22

FOREIGN PATENT DOCUMENTS

JP  04-048664   2/1992
JP   7-112083   11/1995

* cited by examiner

*Primary Examiner*—Minsun Harvey
*Assistant Examiner*—Tod T. Van Roy
(74) *Attorney, Agent, or Firm*—Nields & Lemack

(57) ABSTRACT

A semiconductor laser device, comprising a semiconductor laser array for excitation having a plurality of semiconductor laser elements, and an optical resonator having a solid-state laser medium with a reflection mirror formed on one end surface and an output mirror provided in parallel to the reflection mirror, wherein laser beams emitted from the plurality of the semiconductor laser elements enter the optical resonator independently from each other, and the laser beams are respectively amplified and are projected by the optical resonator.

14 Claims, 8 Drawing Sheets

SEMICONDUCTOR LASER DEVICE

BACKGROUND OF THE INVENTION

The present invention relates to a semiconductor laser device for projecting a laser beam from a semiconductor laser to an end surface of a solid-state laser medium and for irradiating a high-output laser beam by optical pumping (photo-excitation).

An LD solid-state excitation laser is known, which uses a semiconductor laser as an excitation light source or a light emitting source of an excitation light, and which amplifies and projects a laser beam from the light emitting source.

Referring to FIG. 19, brief description will be given below on an LD solid-state excitation laser.

In FIG. 19, reference numeral 1 denotes a light emitter, and 2 denotes an optical resonator. The light emitter 1 comprises an LD light emitting source (semiconductor laser element) 3 for emitting a laser beam as an excitation light, and a condenser lens 4. Further, the optical resonator 2 comprises a laser crystal ($Nd:YVO_4$) plate 6 where a reflection mirror 5 with a dielectric reflection film is formed, and a transparent output reflection plate 8 having an output mirror 7 with a dielectric reflection film on it. At the optical resonator 2, the laser beam is pumped, resonated and amplified, and the laser beam is then outputted.

The laser crystal plate 6 is a solid-state laser medium for performing amplification of light. The solid-state laser medium is, for instance, a solid-state crystal plate using Nd ions or Yb ions as laser active ions. As the laser crystal plate 6, YAG (yttrium aluminum garnet), etc. doped with $Nd^{3+}$ ions is adopted, for instance.

YAG has oscillation lines of 946 nm, 1064 nm, 1319 nm, etc. The laser crystal plate 6 is not limited to YAG. $Nd:YVO_4$ with oscillation line of 1064 nm, Ti:Sapphire with oscillation lines of 700 nm to 900 nm, or a dye laser material with laser dye dispersed in transparent solid material (such as glass, PMMA (macromolecular material)) may be used.

As the light emitting source of the excitation light, the semiconductor laser element (semiconductor laser diode (LD)) is widely propagated as a material for emitting a high-output laser beam at low electric power. Further, there have been strong demands on the laser beam of higher output in recent years. To meet such demands, attempts are now being made to provide the laser beam with higher output by using a plurality of semiconductor laser elements and by bundling together the laser beams emitted from the respective semiconductor laser elements.

One of the methods to bundle the laser beams together is a method to use optical fibers 11 as shown in FIG. 20. Laser beams emitted from the respective semiconductor laser diodes 3 are projected to the optical fibers 11 independently from each other. The optical fibers are then bundled together, and a laser beam is emitted from the bundled optical fibers as an excitation light.

As disclosed in the Japanese Patent Publication 7-112083 of examined patent application, a multiple of laser beams emitted from a multiple of semiconductor lasers are turned independently to parallel beams by a lens array. Further, by a second lens, the laser beams are converged to an end surface of a solid-state laser medium.

In a conventional type semiconductor laser device of high output type as described above, which uses a plurality of semiconductor laser elements, laser beams from the semiconductor laser elements are bundled together by optical fibers. This makes an optical system more complicated. Or, a lens with a large diameter is required because a multiple of laser beams are converged by a lens array. Binding loss due to the binding of laser beams is high, and this leads to the problems such as heating or thermal deformation of optical components caused by the loss of light. Further, when the laser beams are bundled together, excitation input to the solid-state laser medium is increased. In some cases, such problems may occur that the solid-state laser medium may be cracked or thermal distortion may occur. Or, it is difficult to maintain laser characteristics of the projected laser beams.

SUMMARY OF THE INVENTION

It is an object of the present invention to provide a semiconductor laser device using a plurality of semiconductor laser elements, which has a simple optical system and in which burden on a solid-state laser medium is low and laser characteristics of a laser beam can be easily maintained.

To attain the above object, the semiconductor laser device according to the present invention comprises a semiconductor laser array for excitation having a plurality of semiconductor laser elements, and an optical resonator having a solid-state laser medium with a reflection mirror formed on one end surface and an output mirror provided in parallel to the reflection mirror, wherein laser beams emitted from the plurality of the semiconductor laser elements enter the optical resonator independently from each other, and the laser beams are respectively amplified and are projected by the optical resonator. Also, the present invention provides a semiconductor laser device as described above, which comprises at least two sets of light emitting units and an optical element for superimposing laser beams emitted from the two sets of light emitting units, wherein each of the light emitting units comprises a semiconductor laser array for excitation having a plurality of semiconductor laser elements, and an optical resonator having a solid-state laser medium with a reflection mirror formed on one end surface and an output mirror provided in parallel to the reflection mirror, wherein laser beams emitted from the plurality of the semiconductor laser elements enter the optical resonator independently from each other, and the laser beams are respectively amplified and are projected by the optical resonator. Further, the present invention provides a semiconductor laser device as described above, which comprises a plurality of light emitting units which respectively have at least two sets of light emitting subunits and an optical element for superimposing laser beams emitted from the two sets of light emitting subunits, wherein the each subunits comprises a semiconductor laser array for excitation having a plurality of semiconductor laser elements, and an optical resonator having a solid-state laser medium with a reflection mirror formed on one end surface and an output mirror provided in parallel to the reflection mirror, wherein laser beams emitted from the plurality of the semiconductor laser elements enter the optical resonator independently from each other, and the laser beams are respectively amplified and are projected by the optical resonator, and wherein laser beams emitted from the light emitting units are respectively projected to optical fibers and the laser beams are joined to a laser beam by bundling the optical fibers. Also, the present invention provides a semiconductor laser device as described above, wherein a reflection plate is arranged to correspond to the solid-state laser medium, and the output mirror is formed on the reflection plate. Further, the present invention provides a semiconductor laser device as described above, wherein an optical crystal member for wavelength conversion is provided between the reflection mirror and the output mirror.

Also, the present invention provides a semiconductor laser device as described above, wherein a passive Q-sw element is provided between the reflection mirror and the output mirror. Further, the present invention provides a semiconductor laser device as described above, wherein an optical crystal member for wavelength conversion and a passive Q-sw element are provided between the reflection mirror and the output mirror. Also, the present invention provides a semiconductor laser device as described above, wherein the solid-state laser medium is designed in planar shape. Further, the present invention provides a semiconductor laser device as described above, wherein the solid-state laser medium and the reflection plate are designed in planar shape and are piled with each other. Also, the present invention provides a semiconductor laser device as described above, wherein the solid-state laser medium and the optical crystal member for wavelength conversion are designed in planar shape and are piled with each other. Further, the present invention provides a semiconductor laser device as described above, wherein the solid-state laser medium and the passive Q-sw element are designed in planar shape and are piled with each other. Also, the present invention provides a semiconductor laser device as described above, wherein the solid-state laser medium, the optical crystal member for wavelength conversion and the passive Q-sw element are designed in planar shape and are piled with each other. Further, the present invention provides a semiconductor laser device as described above, wherein piling is carried out by use of a spacer. Also, the present invention provides a semiconductor laser device as described above, wherein piling is carried out by use of a spacer. Further, the present invention provides a semiconductor laser device as described above, wherein the spacer is a film formed by means such as coating, vapor deposition. Also, the present invention provides a semiconductor laser device as described above, wherein the semiconductor laser array for excitation is formed by arranging semiconductor laser elements so that fast axis directions of all leaser beams concur with each other, and a rod lens for converging light components of fast axis directions of the laser beams is provided in parallel to the semiconductor laser element array. Further, the present invention provides a semiconductor laser device as described above, wherein the laser beams emitted from the optical resonator are joined together by an optical member and are projected into a single optical fiber.

DETAILED DESCRIPTION OF THE PREFERRED EMBODIMENTS

Figure 1:
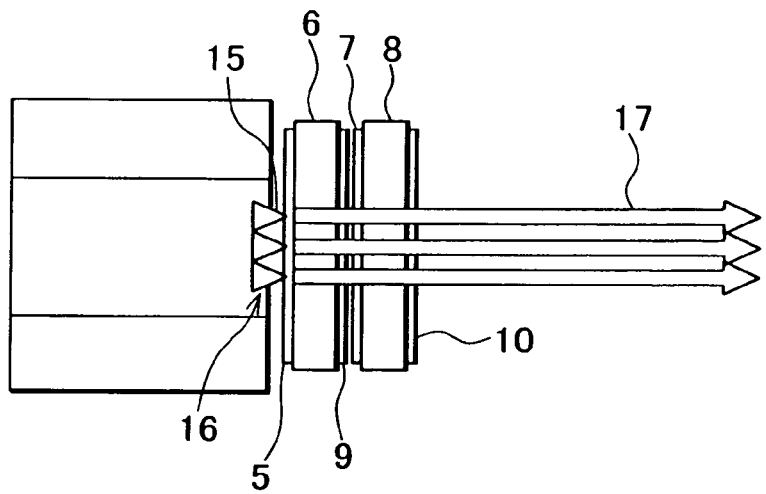
FIG. 1 is a schematical plan view of a first embodiment of the present invention.

Description will be given below on embodiments of the present invention referring to the drawings.

Figure 2:
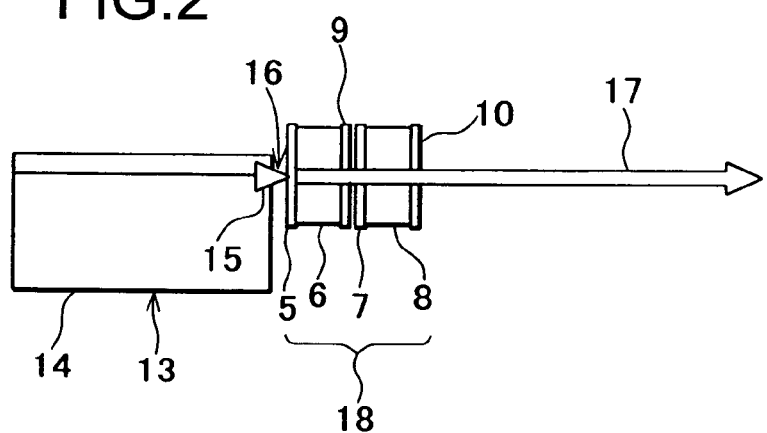
FIG. 2 is a schematical side view of the first embodiment of the present invention.
Figure 19:
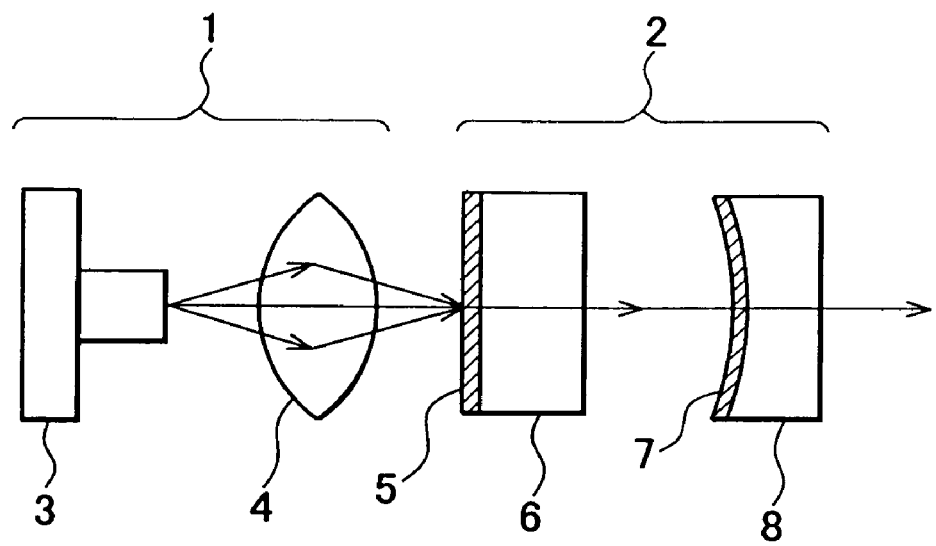
FIG. 19 is a drawing to explain a conventional example.
Figure 20:
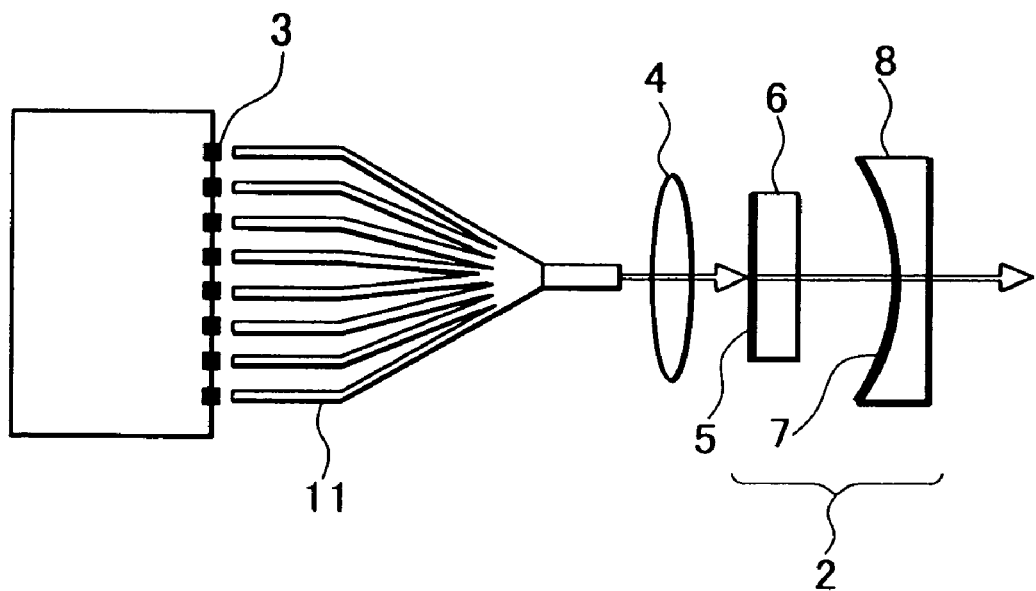
FIG. 20 is a drawing to explain another conventional example.

FIG. 1 and FIG. 2 each represents a first embodiment of the present invention. In the figures, the same component as shown in FIG. 19 is referred by the same symbol.

A light emitter 13 comprises a light source retainer 14 with a flat upper surface, and as many semiconductor laser elements (semiconductor laser diodes (LDs)) 15 as required are arranged on the upper surface of the light source retainer 14. The semiconductor laser elements 15 are arranged in one row with a predetermined pitch to form a semiconductor laser element array 16.

A laser crystal plate (solid-state laser medium plate) 6 is arranged in proximity to the light source retainer 14 and in parallel to the semiconductor laser element array 16, and a transparent output reflection plate 8 is provided in parallel to the laser crystal plate 6.

On an end surface of the laser crystal plate 6 facing to the light emitter 13, there is a reflection mirror 5 which is a dielectric reflection film. On a surface of the output reflection plate 8 facing to the laser crystal plate 6, an output mirror 7, i.e. a dielectric reflection film, is formed. On an end surface of the laser crystal plate 6 closer to the output mirror 7 and on an end surface of the output reflection plate 8 remote from the laser crystal plate 6, AR (Anti Reflection) films 9 and 10 are respectively formed to reduce the loss caused by the reflection.

The output mirror 7 and the AR film 9 are designed in such manner as to face to air and there is formed a gap between the output mirror 7 and the AR film 9 although it is a slight gap. As a means to form the gap, the laser crystal plate 6 and the output reflection plate 8 by support members respectively, and a gap may be formed by the support members. Or, a frame-like spacer may be placed between the laser crystal plate 6 and the output reflection plate 8, and the laser crystal plate 6 and the output reflection plate 8 may be assembled together by piling one upon another.

On a joint surface of at least one of the laser crystal plate 6 and the output reflection plate 8, an adequate material such as aluminum may be vapor-deposited in form of a frame, and a film may be formed as a spacer.

The laser crystal plate 6, the reflection mirror 5, the output mirror 7, and the output reflection plate 8 make up together an optical resonator 18.

Laser beams 17 emitted from the semiconductor laser elements 15 pass through the reflection mirror 5 and enter the optical resonator 18. The laser beams 17 are pumped between the reflection mirror 5 and the output mirror 7. After being subjected to resonation and amplification, the laser beams 17 are projected from the output reflection plate 8.

The laser beams 17 projected from the plurality of the semiconductor laser elements 15 are resonated and amplified independently from each other by the optical resonator 18. Thus, the laser beams 17 projected from the output reflection plate 8 are also separated independently from each other. As a result, as many laser beams 17 as the semiconductor laser elements 15 are projected.

Each of the laser beams 17 entering the laser crystal plate 6 from the semiconductor laser element 15 has low energy. Although the laser beams 17 are projected to the laser crystal plate 6 from the multiple of the semiconductor laser elements 15, thermal effect to the laser crystal plate 6 is dispersed, and occurrence of cracking of a crystal, thermal distortion, etc. can be avoided.

Figure 3:
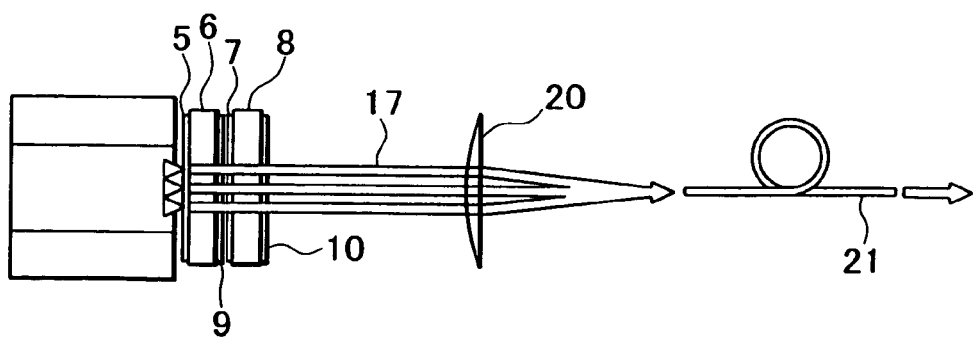
FIG. 3 is a schematical plan view of a second embodiment of the present invention.
Figure 4:
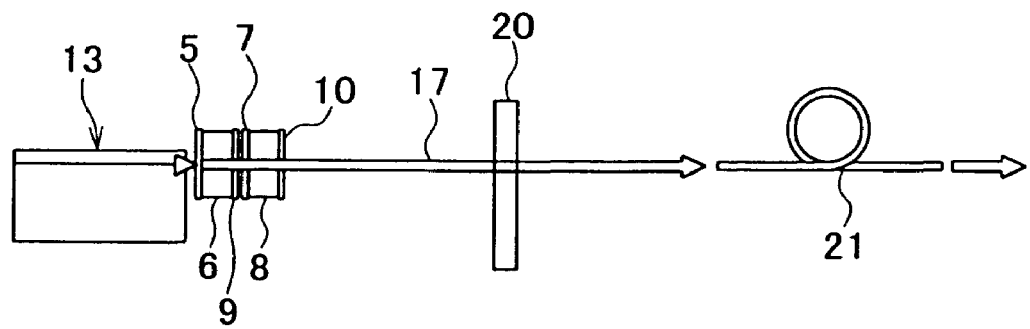
FIG. 4 is a schematical side view of the second embodiment of the present invention.

FIG. 3 and FIG. 4 each represents a second embodiment of the present invention.

In the second embodiment, the laser beams 17 projected from the output reflection plate 8 are joined together through a cylindrical lens 20, and the laser beams are projected to a single optical fiber 21.

The laser beams 17 projected from the output reflection plate 8 are within the same plane and are running in parallel to each other. The cylindrical lens 20 is arranged to correspond to the output reflection plate 8, and an optical axis of the cylindrical lens 20 is made parallel to the laser beams 17. By the cylindrical lens 20, the laser beams 17 are joined at a single point. An end surface of the optical fiber 21 is positioned at a joining point of the laser beams 17, and all of the laser beams 17 emitted from the semiconductor laser elements 15 are projected to the optical fiber 21. From an other end of the optical fiber 21, all laser beams 17 joined together are irradiated. As an optical member to join the laser beams 17 projected from the output reflection plate 8, instead of the cylindrical lens 20, the laser beams 17 are projected to the optical fibers 21 independently from each other, and the optical fibers 21 may be bundled together.

Figure 5:
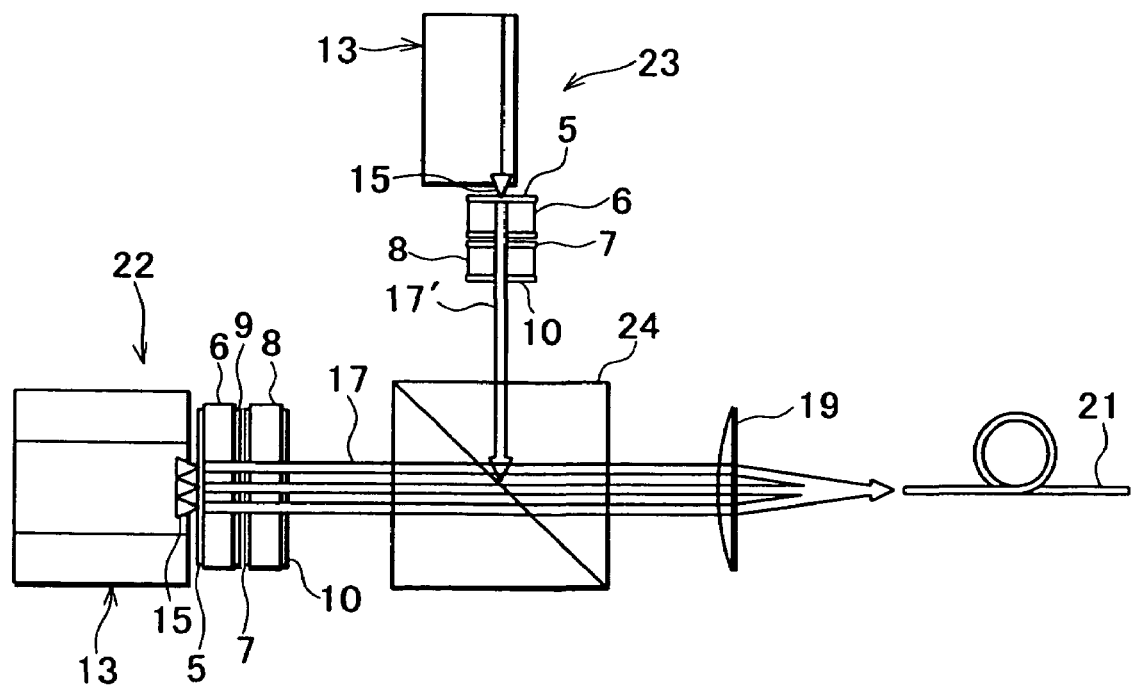
FIG. 5 is a schematical plan view of a third embodiment of the present invention.

FIG. 5 shows a third embodiment of the present invention.

In the third embodiment, two sets of the semiconductor laser devices as shown in the first embodiment are used as light emitting units 22 and 23.

In the light emitting units 22 and 23, as many semiconductor laser elements 15 as required are arranged on an upper surface of the light source retainer 14 and these elements make up together a light emitter 13. The semiconductor laser elements 15 are arranged in one row with a predetermined pitch and form a semiconductor laser element array 16. A laser crystal plate (solid-state laser medium plate) 6 is provided in parallel to the semiconductor laser element array 16. Further, an output reflection plate 8 is arranged in parallel to the laser crystal plate 6. On an end surface of the laser crystal plate 6 facing to the light emitter 13, a reflection mirror 5, i.e. a dielectric reflection film, is provided. On a surface of the output reflection plate 8 facing to the laser crystal plate 6, an output mirror 7, i.e. a dielectric reflection film, is arranged. On an end surface of the laser crystal plate 6 closer to the output mirror 7 and on an end surface of the output reflection plate 8 remote from the laser crystal plate 6, AR films 9 and 10 are formed respectively.

A plane including the laser beams 17 emitted from the light emitting unit 22 perpendicularly crosses a plane, which includes laser beams 17' emitted from the light emitting unit 23. A direction of polarization of the laser beams 17 emitted from the light emitting unit 22 is deviated by an angle of 90° from a direction of polarization of the laser beams 17' emitted from the light emitting unit 23.

A polarizing mirror 24 is arranged at a point where the laser beams 17 perpendicularly cross the laser beams 17'. The polarizing mirror 24 is designed in such manner that it allows the laser beams 17 from the light emitting unit 22 to pass and reflects the laser beams 17' from the light emitting unit 23. When the laser beams 17 pass through the polarizing mirror 24 and the laser beams 17' are reflected by the polarizing mirror 24, the laser beams 17 and the laser beams 17' are superimposed on each other.

With the polarizing mirror 24 at the middle, a condenser lens 19 is positioned on an opposite side of the light emitting units 22 and 23. A plurality of the laser beams 17 after passing through the polarizing mirror 24 are joined together with a plurality of laser beams 17' reflected by the polarizing mirror 24 on an end surface of the optical fiber 21. The laser beams irradiated from the optical fiber 21 form a combination of the laser beams 17 and 17' emitted respectively from all of the semiconductor laser elements 15 of the light emitting unit 22 and emitted from all of the semiconductor elements 15 of the light emitting unit 23. The polarizing mirror 24 plays a role of an optical element to superimpose together the laser beams 17 and 17' emitted from two sets of the light emitting units 22 and 23 respectively.

As a variation of the third embodiment, frequency of the laser beams 17 emitted from the light emitting unit 22 is made different from frequency of the laser beams 17' emitted from the light emitting unit 23, and the laser beams 17 and the laser beams 17' can be superimposed one upon another. In this case, an optical filter is used as an optical element instead of the polarizing mirror 24. The optical filter allows the laser beams 17 to pass and reflects the laser beams 17'. In this variation also, it is possible to superimpose the laser beams 17 from the light emitting unit 22 with the laser beams 17' from the light emitting unit 23. In this variation, laser beams of two different colors can be superimposed on each other.

Figure 6:
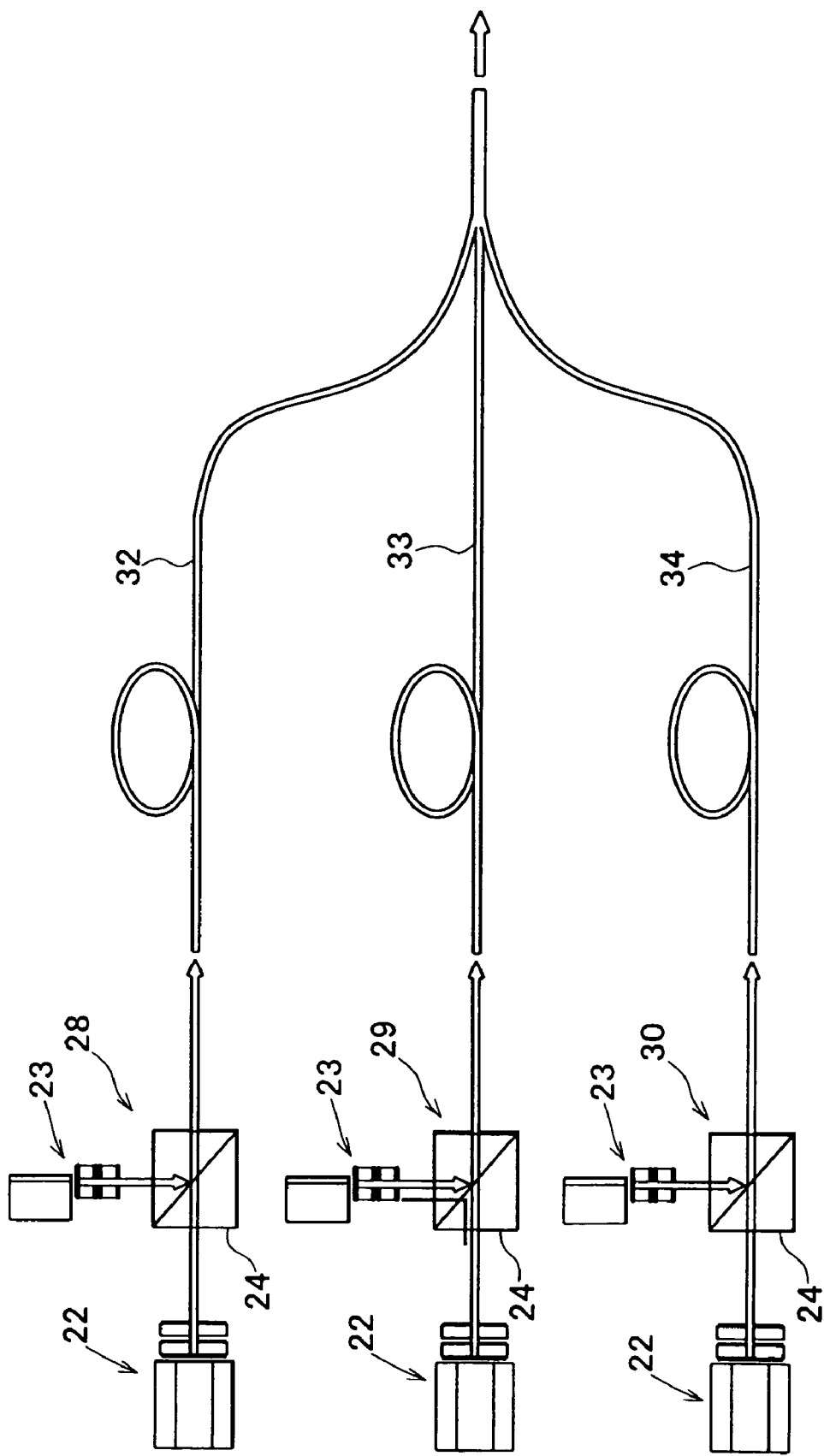
FIG. 6 is a schematical plan view of a fourth embodiment of the present invention.

FIG. 6 shows a fourth embodiment of the present invention.

In the fourth embodiment, the semiconductor laser devices as shown in the first embodiment are used as the light emitting subunits 22 and 23 to make up the semiconductor laser device shown in the third embodiment, and two sets or more (3 sets are shown in the figure) of the semiconductor laser devices of the third embodiment are used as the light emitting units 28, 29 and 30. In FIG. 6, the same component as shown in FIG. 5 is referred by the same symbol.

Optical fibers 32, 33 and 34 are provided to correspond to the light emitting units 28, 29 and 30 respectively, and end surfaces of the optical fibers 32, 33 and 34 are respectively aligned with each joining points of the laser beams of the light emitting units 28, 29 and 30. The optical fibers 32, 33 and 34 are bundled together at a predetermined position, and the laser beams projected from the optical fibers 32, 33 and 34 are also bundled together.

In the fourth embodiment, the laser beams from a multiple of the semiconductor laser elements can be superimposed together to form a single laser beam. Also, it is possible to change frequencies (colors) of the laser beams emitted from the light emitting units 28, 29 and 30.

Figure 7:
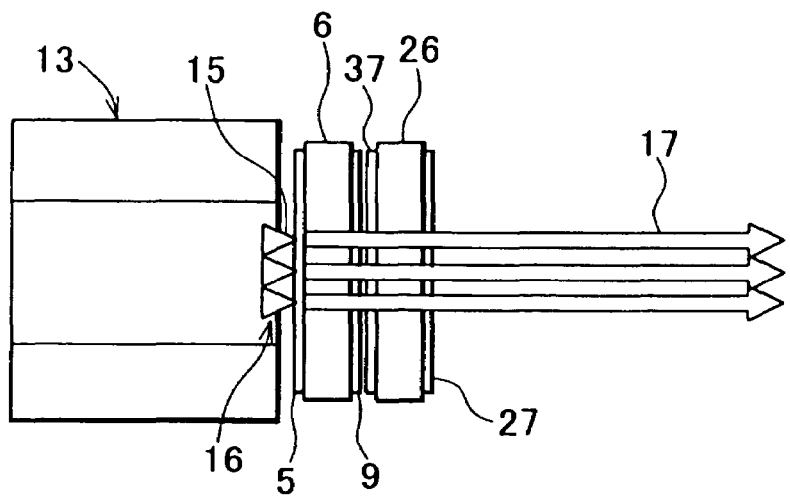
FIG. 7 is a schematical plan view of a fifth embodiment of the present invention.

A fifth embodiment of the invention is shown in FIG. 7. In FIG. 7, the same component as shown in FIG. 1 is referred by the same symbol.

In the fifth embodiment, a crystal plate 26 for wavelength conversion (non-linear optical medium plate) is used instead of the output reflection plate 8. As the crystal plate 26 for wavelength conversion, for instance, KTP (KTiOPO$_4$; titanyl potassium phosphate), BBO (β-BaB$_2$O$_4$; β-type lithium borate), LBO (LiB$_3$O$_5$; lithium triborate), etc. are used. The inputted wavelength of 1064 nm is converted to ½ of the initial frequency, i.e. 532 nm. Also, KNbO$_3$ (potassium niobate), etc. is also used, and the inputted wavelength of 946 nm is converted to ½ of the initial frequency, i.e. 473 nm.

On an end surface of the laser crystal plate 6 facing to the light emitter 13, a reflection mirror 5, i.e. a dielectric reflection film, is provided. The reflection mirror 5 is highly transmissive to a light emission wavelength of the semiconductor laser element 15 and is highly reflective to an oscillation wavelength of the laser crystal plate 6. It is highly reflective to SHG (second harmonic generation). On the other end surface of the laser crystal plate 6, an AR film 9 is arranged.

The crystal plate 26 for wavelength conversion is provided in parallel to the laser crystal plate 6. On an end surface of the crystal plate 26 for wavelength conversion facing to the laser crystal plate 6, an AR film 37 is formed. On the other end surface of the crystal plate 26 for wavelength conversion, a second output mirror 27, i.e. a dielectric reflection film, is arranged. The second output mirror 27 is highly reflective to the oscillation wavelength of the laser crystal plate 6, and it is highly transmissive to SHG.

In the fifth embodiment, the laser beams 17 emitted from the semiconductor laser elements 15 are pumped between the reflection mirror 5 and the second output mirror 27. The laser beams are independently converted to SHG by the crystal plate 26 for wavelength conversion and are amplified and irradiated.

By using the fifth embodiment as a light emitting unit, a plurality of laser beams can be joined together to a single laser beam by means of a cylindrical lens in the same manner as shown in FIG. 3 and FIG. 4. Further, in an arrangement similar to the one shown in FIG. 5 and FIG. 6, a plurality of the light emitting units can be combined together, and a further multiple of the laser beams emitted from the semiconductor laser elements can be joined together.

Figure 8:
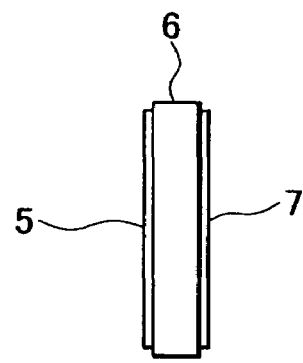
FIG. 8 is a schematical plan view of an essential portion of a sixth embodiment of the present invention.

FIG. 8 shows a sixth embodiment of the invention. The output reflection plate 8 as shown in the first embodiment is not used. A reflection mirror 5, i.e. a dielectric reflection film, is provided on an end surface of the laser crystal plate 6, and an output mirror 7, i.e. a dielectric reflection film, is provided on the other end surface.

Figure 9:
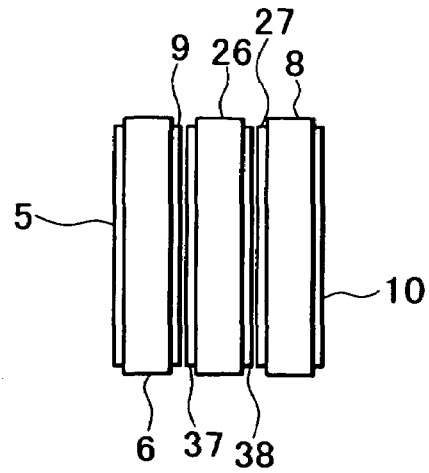
FIG. 9 is a schematical plan view of an essential portion of a seventh embodiment of the present invention.

FIG. 9 shows a seventh embodiment. In this embodiment, a crystal plate 26 for wavelength conversion is arranged between the laser crystal plate 6 and the output reflection plate 8.

A reflection mirror 5, i.e. a dielectric reflection film, is provided on an end surface of the laser crystal plate 6 closer to a semiconductor laser element (not shown). An AR film 9 is formed on an end surface closer to the crystal plate 26 for wavelength conversion. AR films 37 and 38 are formed on both end surfaces of the crystal plate 26 for wavelength conversion. A second output mirror 27, i.e. a dielectric reflection film, is arranged on an end surface of the output reflection plate 8 closer to the crystal plate 26 for wavelength conversion, and an AR film 10 is formed on the other end surface.

In the seventh embodiment also, similarly to the fifth embodiment as given above, the laser beams emitted from the semiconductor laser elements (not shown) are pumped between the reflection mirror 5 and the second output mirror 27. By the crystal plate 26 for wavelength conversion, the laser beams are independently converted to SHG and amplified and irradiated.

In the seventh embodiment, the laser crystal plate 6, the crystal plate 26 for wavelength conversion, and the output reflection plate 8 are designed in planar shape respectively. Assembling is simply attained by piling with each other. Also, a spacer (not shown) is provided to form a gap as shown in the first embodiment between the laser crystal plate 6 and the crystal plate 26 for wavelength conversion and between the crystal plate 26 for wavelength conversion and the output reflection plate 8. A film serving as the spacer can be formed by attaching an adequate material such as aluminum in frame-like shape on one of the adjacent surfaces by vapor deposition.

Figure 10:
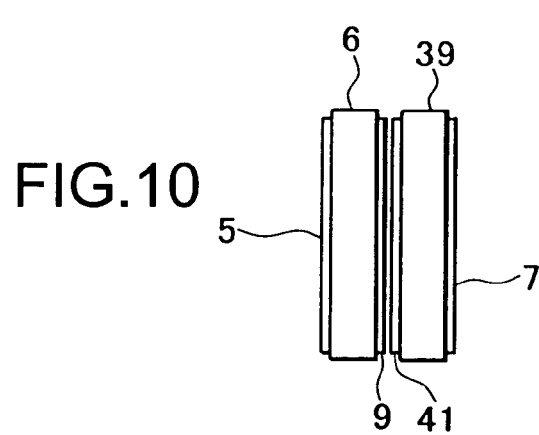
FIG. 10 is a schematical plan view of an essential portion of an eighth embodiment of the present invention.

FIG. 10 shows an eighth embodiment of the invention.

The laser crystal plate 6 is arranged in parallel to a semiconductor laser element array (not shown). A reflection mirror 5, i.e. a dielectric reflection film, is provided on an end surface of the laser crystal plate 6 closer to the semiconductor laser element (not shown), and an AR film 9 is positioned on an end surface on an opposite side. A passive Q-sw 39 in planar shape is arranged in parallel to the laser crystal plate 6, and the passive Q-sw 39 comprises an oversaturated absorptive substance (crystal material). On an end surface of the passive Q-sw 30 closer to the laser crystal plate 6, an AR film 41 is provided, and an output mirror 7, i.e. a dielectric reflection film, is provided on an opposite surface.

An optical resonator is formed between the reflection mirror 5 and the output mirror 7, and laser beams entering the optical resonator after passing through the reflection mirror 5 are pumped. The passive Q-sw 39 receives the incident laser beams through oversaturated absorption. When the absorbed amount exceeds a predetermined level, the laser beam is projected, and the passive Q-sw 39 performs switching action.

In the semiconductor device as shown in the eighth embodiment, the laser beam is projected in pulse-like manner by the switching action of the passive Q-sw 39.

As the material for the passive Q-sw 39, for instance, Cr:YAG or the like may be used.

Figure 11:
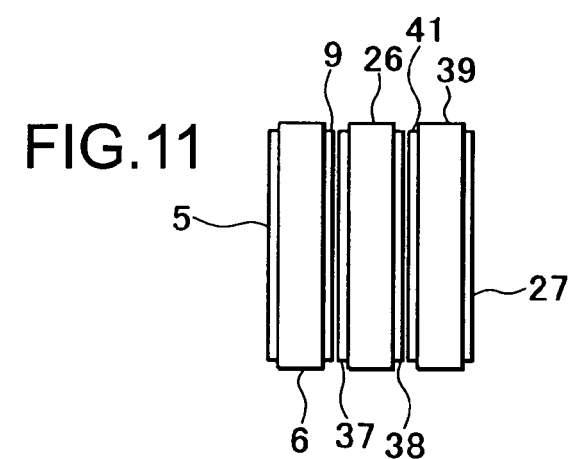
FIG. 11 is a schematical plan view of an essential portion of a ninth embodiment of the present invention.

FIG. 11 shows a ninth embodiment of the invention.

In the ninth embodiment, a crystal plate 26 for wavelength conversion is further added to the eighth embodiment. That is, the crystal plate 26 for wavelength conversion is provided between the laser crystal plate 6 and the passive Q-sw 39.

On an end surface (right end surface in FIG. 11) of the passive Q-sw 39 remote from the crystal plate 26 for wavelength conversion, a second output mirror 27, i.e. a dielectric reflection film, is formed, which is highly reflective to an oscillation wavelength of the laser crystal plate 6 and highly transmissive to SHG. On an end surface of the laser crystal plate 6 closer to the crystal plate 26 for wavelength conversion, on both end surfaces of the crystal plate 26 for wavelength conversion, and on an end surface of the passive Q-sw 39 closer to the crystal plate 26 for wavelength conversion, AR films 9, 37, 38, and 41 are formed respectively. Similarly to the seventh embodiment, gaps are respectively formed by the use of spacers between the laser crystal plate 6 and the crystal plate 26 for wavelength conversion and between the crystal plate 26 for wavelength conversion and the passive Q-sw 39.

The incident laser beams entering through the reflection mirror 5 are pumped between the reflection mirror 5 and the second output mirror 27. By the crystal plate 26 for wavelength conversion, the laser beams are independently converted to SHG. Further, by the passive Q-sw 39, the laser beams are converted to pulse-like laser beams and are projected.

Figure 12:
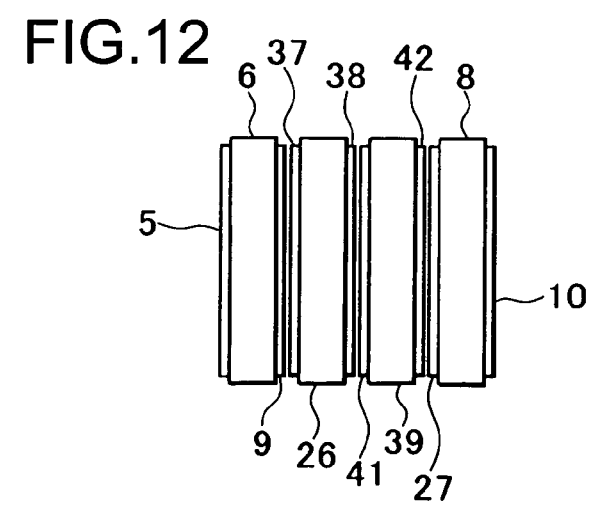
FIG. 12 is a schematical plan view of an essential portion of a tenth embodiment of the present invention.

FIG. 12 represents a tenth embodiment.

In the tenth embodiment, an output reflection plate 8 is added to the ninth embodiment. A second output mirror 27, i.e. a dielectric reflection film, is formed on an end surface of the output reflection plate 8 closer to the passive Q-sw 39, and an AR film 10 is formed on an end surface of the output reflection plate 8 remote from the passive Q-sw 39. On both end surfaces of the passive Q-sw 39, AR films 41 and 42 are formed. The other arrangement is the same as that of the ninth embodiment shown in FIG. 11, and detailed description is not given here.

Figure 13:
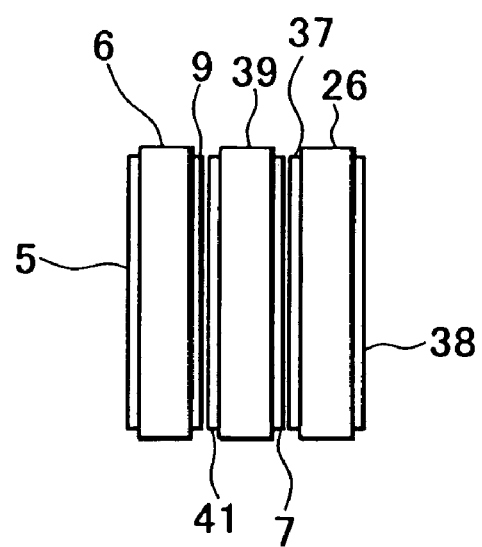
FIG. 13 is a schematical plan view of an essential portion of an eleventh embodiment of the present invention.

FIG. 13 shows an eleventh embodiment.

A laser crystal plate 6 is arranged in parallel to a semiconductor laser element array (not shown), and a reflection mirror 5, i.e. a dielectric reflection film, is provided on an end surface of the laser crystal plate 6 closer to the semiconductor laser element (not shown). On an end surface on an opposite side, an AR film 9 is formed. A passive Q-sw 39 in planar shape is provided in parallel to the laser crystal plate 6. On an end surface of the passive Q-sw 39 closer to the laser crystal plate 6, an AR film 41 is arranged, and an output mirror 7, i.e. a dielectric reflection film, is provided on an opposite side. A crystal plate 26 for wavelength conversion is arranged in parallel to the passive Q-sw 39, and AR films 37 and 38 are formed on both end surfaces of the crystal plate 26 for wavelength conversion respectively.

In the eleventh embodiment, an optical resonator is formed between the reflection mirror 5 and the output mirror 7. Incident laser beams entering after passing through the reflection mirror 5 are pumped and amplified. Then, the pulse-like laser beams are converted to SHG by the crystal plate 26 for wavelength conversion, and projected.

Figure 14:
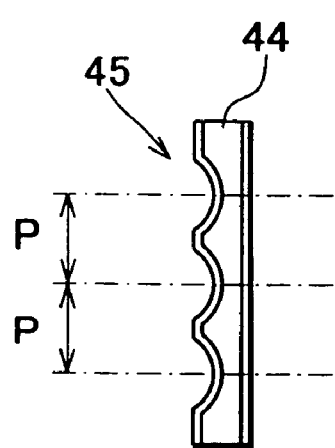
FIG. 14 shows a variation of an optical member where an output mirror is provided.

As shown in FIG. 14, on an incident surface of an optical member 44 where the output mirror 7 and the second output mirror 27 are arranged (in the above embodiments, the optical member 44 corresponds to the output reflection plate 8 in FIG. 1, to the crystal plate 26 for wavelength conversion in FIG. 7, to the laser crystal plate 6 in FIG. 8, and to the passive Q-sw 39 in FIG. 10), there is formed a concave surface reflection mirror array 45 which has concave reflection surfaces for each optical axis of the semiconductor laser elements 15, i.e. with the same pitch P as the pitch that the semiconductor laser elements 15 provided.

Figure 15:
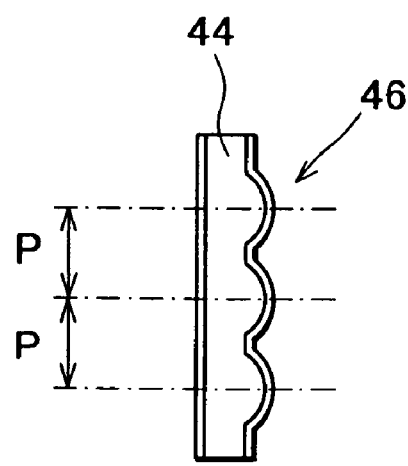
FIG. 15 shows a variation of the optical member where the output mirror is provided.

As shown in FIG. 15, a convex surface reflection mirror array 46 is formed in case the output mirror 7 and the second output mirror 27 are arranged on an exit surface of the optical member 44.

Figure 16:
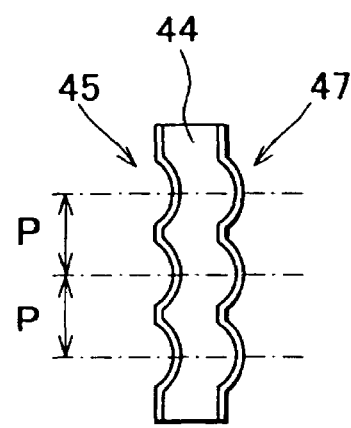
FIG. 16 shows a variation of the optical member where the output mirror is provided.

As shown in FIG. 16, when the output mirror 7 and the second output mirror 27 are arranged on an incident surface of the optical member 44, a concave surface reflection mirror array 45 may be formed, and a convex surface array 47 may be formed, which converges the laser beams to the exit surface.

By the concave or convex surface reflection mirror array, it is possible to suppress the spreading of the laser beams and to output the laser beams running in more parallel to each other.

Figure 17:
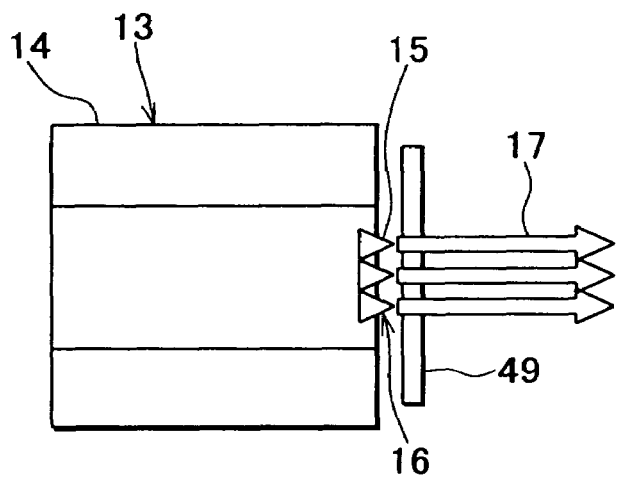
FIG. 17 is a schematical plan view showing an application example of a light emitter.
Figure 18:
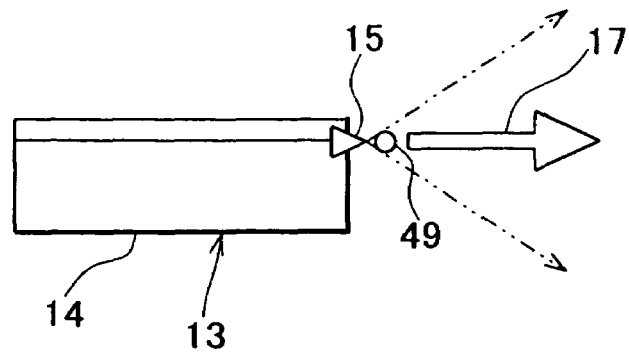
FIG. 18 is a schematical side view showing the application example of the light emitter.

FIG. 17 and FIG. 18 each represents an application example of the light emitter 13. In the figures, an optical resonator comprising a reflection mirror 5, a laser crystal plate 6, an output reflection plate 8, etc. is not shown.

The laser beams 17 emitted from semiconductor laser elements 15 have larger spreading angles in one direction and have smaller spreading angles in a direction perpendicular to the above direction. In this application example, the semiconductor laser elements 15 for projecting the laser beams 17 are arranged so as to form the semiconductor laser element array 16 so that the laser beams have larger spreading angles in an up-to-bottom direction (fast axis), and a rod lens 49 is arranged in parallel to the semiconductor laser element array 16.

Light components in the fast axis direction of the laser beams 17 emitted from the semiconductor laser elements 15 are converged by the rod lens 49 and the laser beams enter an optical resonator (not shown). As a result, the laser beams 17 can be amplified with higher efficiency.

In the above embodiments, a gap is formed between the optical members, while these may be assembled by closely attaching to each other. In this case, the AR film formed between the optical members is formed by giving full consideration on the difference between refractive indices of the optical members.

The present invention provides a semiconductor laser device, which comprises a semiconductor laser array for excitation having a plurality of semiconductor laser elements, and an optical resonator having a solid-state laser medium with a reflection mirror formed on one end surface and an output mirror provided in parallel to the reflection mirror, wherein laser beams emitted from the plurality of the semiconductor laser elements enter the optical resonator independently from each other, and the laser beams are respectively amplified and are projected by the optical resonator. As a result, energy of the laser beams entering the solid-state laser medium is dispersed, and this contributes to the prevention of occurrence of cracking of the solid-state laser medium and of thermal distortion, and stable projection of the laser beams is assured.

Optical members such as the solid-state laser medium, the reflection plate, the optical crystal member for wavelength conversion, and the passive Q-sw element, etc. are designed in planar shape and can be piled with each other. This facilitates the assembling of these components.

The spacer is a film formed by coating, vapor deposition, etc. Thus, small gaps can be provided easily and with high accuracy.

What is claimed is:

1. A semiconductor laser device, comprising at least two sets of light emitting units and a polarizing optical element, wherein directions of polarization of laser beams emitted from said two sets of light emitting units are deviated from each other and said polarizing optical element superimposes the laser beams emitted from said two sets of light emitting units by reflecting one of the laser beams and by allowing the other of the laser beams to pass, wherein each of said light emitting units comprises a semiconductor laser array for excitation having a plurality of semiconductor laser elements, and an optical resonator having a solid-state laser medium with a reflection mirror formed on one end surface and an output mirror provided in parallel to said reflection mirror, wherein said solid state laser medium and said output mirror are joined by using a spacer so as to form a gap, and laser beams emitted from the plurality of said semiconductor laser elements enter said optical resonator independently from each other, and the laser beams are respectively amplified and are projected by said optical resonator.

2. A semiconductor laser device, comprising a plurality of light emitting units which respectively have at least two sets of light emitting subunits and a polarizing optical element, wherein directions of polarization of laser beams emitted from said two sets of light emitting subunits are deviated from each other and said polarizing optical element superimposes the laser beams emitted from said two sets of light emitting subunits by reflecting one of the laser beams and by allowing the other of the laser beams to pass, wherein each said subunit comprises a semiconductor laser array for excitation having a plurality of semiconductor laser elements, and an optical resonator having a solid-state laser medium with a reflection mirror formed on one end surface and an output mirror provided in parallel to said reflection mirror, wherein said solid state laser medium and said output mirror are jointed by using a spacer so as to form a gap, and laser beams emitted from the plurality of said semiconductor laser elements enter said optical resonator independently from each other, and the laser beams are respectively amplified and are projected by said optical resonator, and wherein laser beams emitted from said light emitting units are respectively projected to optical fibers and the laser beams are joined to a laser beam by bundling said optical fibers.

3. A semiconductor laser device according to claim 1 or 2, wherein a reflection plate is arranged to correspond to the solid-state laser medium, and said output mirror is formed on said reflection plate.

4. A semiconductor laser device according to claim 1 or 2, wherein an optical crystal member for wavelength conversion is provided between said reflection mirror and said output mirror.

5. A semiconductor laser device according to claim 1 or 2, wherein a passive Q-sw element is provided between said reflection mirror and said output mirror.

6. A semiconductor laser device according to claim 1 or 2, wherein an optical crystal member for wavelength conversion and a passive Q-sw element are provided between said reflection mirror and said output mirror.

7. A semiconductor laser device according to claim 1 or 2, wherein said solid-state laser medium is designed in planar shape.

8. A semiconductor laser device according to claim 3, wherein said solid-state laser medium and said reflection plate are designed in planar shape and are piled with each other.

9. A semiconductor laser device according to claim 4, wherein said solid-state laser medium and said optical crystal member for wavelength conversion are designed in planar shape and are piled with each other.

10. A semiconductor laser device according to claim 5, wherein said solid-state laser medium and said passive Q-sw element are designed in planar shape and are piled with each other.

11. A semiconductor laser device according to claim 6, wherein said solid-state laser medium, said optical crystal member for wavelength conversion and said passive Q-sw element are designed in planar shape and are piled with each other.

12. A semiconductor laser device according to claim 1 or 2, wherein said spacer is a film formed by coating, or vapor deposition.

13. A semiconductor laser device according to claim 1 or 2, wherein said semiconductor laser array for excitation is formed by arranging semiconductor laser elements so that fast axis directions of all laser beams concur with each other, and a rod lens for converging light components of fast axis directions of the laser beams is provided in parallel to said semiconductor laser element array.

14. A semiconductor laser device according to claim 2, wherein the laser beams emitted from said optical resonator are joined together by an optical member and are projected into a single optical fiber.

* * * * *